(12) United States Patent
Sankaran et al.

(10) Patent No.: US 9,143,100 B2
(45) Date of Patent: Sep. 22, 2015

(54) METHOD AND CIRCUITRY FOR MULTI-STAGE AMPLIFICATION

(71) Applicant: Texas Instruments Incorporated, Dallas, TX (US)

(72) Inventors: Swaminathan Sankaran, Allen, TX (US); Bradley Allen Kramer, Plano, TX (US); Hassan Ali, Murphy, TX (US); Nirmal C. Warke, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 39 days.

(21) Appl. No.: 14/066,980

(22) Filed: Oct. 30, 2013

(65) Prior Publication Data

US 2015/0091642 A1 Apr. 2, 2015

Related U.S. Application Data

(60) Provisional application No. 61/884,444, filed on Sep. 30, 2013.

(51) Int. Cl.
*H03F 3/45* (2006.01)
*H03F 1/00* (2006.01)

(52) U.S. Cl.
CPC ... *H03F 3/45* (2013.01); *H03F 1/00* (2013.01)

(58) Field of Classification Search
CPC ....... H03F 2200/537; H03F 1/00; H03F 1/42; H03F 3/45
USPC ......... 330/69, 75, 90, 98, 100, 102, 107, 109, 330/165, 252, 260
See application file for complete search history.

(56) References Cited

U.S. PATENT DOCUMENTS

| | | | | |
|---|---|---|---|---|
| 3,885,219 A * | 5/1975 | Vaughn | ........................ | 330/255 |
| 3,997,850 A * | 12/1976 | Gundry | ........................ | 330/259 |
| 4,336,509 A * | 6/1982 | Bernitz | ........................ | 331/114 |
| 7,215,194 B2 * | 5/2007 | Kucharski et al. | ............ | 330/252 |
| 7,304,535 B2 * | 12/2007 | Lam | ................. | 330/69 |
| 2002/0171480 A1 | 11/2002 | Piessens et al. | | |
| 2005/0134378 A1 | 6/2005 | Westwick et al. | | |
| 2007/0030077 A1 | 2/2007 | Behzad | | |

FOREIGN PATENT DOCUMENTS

EP 2685630 A1 * 7/2012 ................ H03F 3/45

OTHER PUBLICATIONS

International Search Report and Written Opinion for PCT/US2014/058168 mailed Mar. 26, 2015.

* cited by examiner

*Primary Examiner* — Steven J Mottola
*Assistant Examiner* — Hafizur Rahman
(74) *Attorney, Agent, or Firm* — Michael A. Davis, Jr.; Frank D. Cimino

(57) ABSTRACT

In an amplifier, a first stage receives a differential input voltage, which is formed by first and second input voltages, and outputs a first differential current in response thereto on first and second lines having respective first and second line voltages. A second stage receives the first and second line voltages and outputs a second differential current in response thereto on third and fourth lines having respective third and fourth line voltages. A transformer includes first and second coils. A first terminal of the first coil is coupled through a first resistor to the first line. A second terminal of the first coil is coupled through a second resistor to the second line. A first terminal of the second coil is coupled through a third resistor to the third line. A second terminal of the second coil is coupled through a fourth resistor to the fourth line.

18 Claims, 2 Drawing Sheets

METHOD AND CIRCUITRY FOR MULTI-STAGE AMPLIFICATION

CROSS-REFERENCE TO RELATED APPLICATION

This application claims priority to U.S. Provisional Patent Application Ser. No. 61/884,444, filed Sep. 30, 2013, entitled METHOD AND CIRCUITRY FOR MULTI-STAGE AMPLIFICATION, naming Swaminathan Sankaran et al. as inventors, which is hereby fully incorporated herein by reference for all purposes.

BACKGROUND

The disclosures herein relate in general to electronic circuitry, and in particular to a method and circuitry for multi-stage amplification.

FIG. 1 (prior art) is a schematic electrical circuit diagram of a conventional multi-stage amplifier, indicated generally at 100. The amplifier 100 includes at least first and second stages 102 and 104, which are transconductance amplifiers whose gains are Gm1 and Gm2, respectively. The amplifier 100 receives a differential input voltage from lines $S_{00}$ and $S_{01}$.

The first stage 102 applies the gain Gm1 to amplify a difference ("$\Delta N_{IN}$") between $S_{00}$'s voltage ("$V_{IN}+$") and $S_{01}$'s voltage ("$V_{IN}-$"). Similarly, the second stage 104 applies the gain Gm2 to amplify a difference ("$\Delta V_1$") between a line $S_{10}$'s voltage ("$V_{10}$") and a line $S_{11}$'s voltage ("$V_{11}$"). Accordingly: (a) in response to $\Delta V_{IN}$, the first stage 102 generates a difference ("$\Delta I_1$") between $S_{01}$'s current ("$I_{10}$") and $S_{11}$'s current ("$I_{11}$"); and (b) in response to $\Delta V_1$, the second stage 104 generates a difference ("$\Delta I_2$") between a line $S_{20}$'s current ("$I_{20}$") and a line $S_{21}$'s current ("$I_{21}$").

As shown in FIG. 1, $S_{10}$ is connected to a resistor $R_{10}$, which is coupled through a first terminal of an inductor $L_1$ to a voltage supply node $V_{DD}$. Also, $S_{11}$ is connected to a resistor $R_{11}$, which is coupled through a second terminal of $L_1$ to $V_{DD}$. Similarly, $S_{20}$ is connected to a resistor $R_{20}$, which is coupled through a first terminal of an inductor $L_2$ to $V_{DD}$. Further, $S_{21}$ is connected to a resistor $R_{21}$, which is coupled through a second terminal of $L_2$ to $V_{DD}$.

FIG. 2 (prior art) is a graph of an example curve 202 of gain (dB) versus frequency for the amplifier 100, having a 3 dB bandwidth region 204. As shown in FIG. 2, the 3 dB bandwidth region 204 is a range of frequencies whose gains are within 3 dB of peak gain. Without $L_1$, $L_2$, $R_{10}$, $R_{11}$, $R_{20}$ and $R_{21}$, performance the amplifier 100 could diminish, according to an example curve 206 having a 3 dB bandwidth region 208.

By comparison, with $L_1$, $L_2$, $R_{10}$, $R_{11}$, $R_{20}$ and $R_{21}$: (a) in the region 208, a dominant contribution to the 3 dB bandwidth region 204 is provided by $R_{10}$, $R_{11}$, $R_{20}$ and $R_{21}$; and (b) in a bandwidth expansion region 210, a significant contribution to the 3 dB bandwidth region 204 is provided by $L_1$ and $L_2$, in addition to contribution by $R_{10}$, $R_{11}$, $R_{20}$ and $R_{21}$.

Nevertheless, the amplifier 100 has shortcomings. For example, the amplifier 100 has one passive magnetic component (e.g., inductor) per stage. As a precaution against possible interference through magnetic field coupling (e.g., between coil windings of nearby inductors), a spacing is imposed between those passive magnetic components, which increases silicon area in an integrated circuit that contains the amplifier 100.

SUMMARY

In an amplifier, a first stage receives a differential input voltage, which is formed by first and second input voltages, and outputs a first differential current in response thereto on first and second lines having respective first and second line voltages. A second stage receives the first and second line voltages and outputs a second differential current in response thereto on third and fourth lines having respective third and fourth line voltages. A transformer includes first and second coils. A first terminal of the first coil is coupled through a first resistor to the first line. A second terminal of the first coil is coupled through a second resistor to the second line. A first terminal of the second coil is coupled through a third resistor to the third line. A second terminal of the second coil is coupled through a fourth resistor to the fourth line.

DETAILED DESCRIPTION

Figure 1:
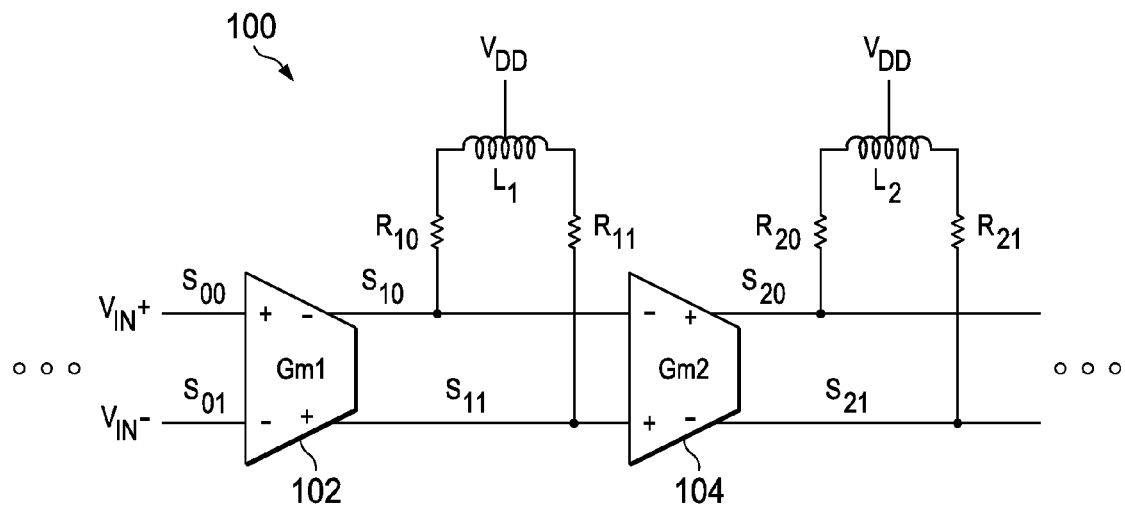
FIG. 1 (prior art) is a schematic electrical circuit diagram of a conventional multi-stage amplifier.
Figure 2:
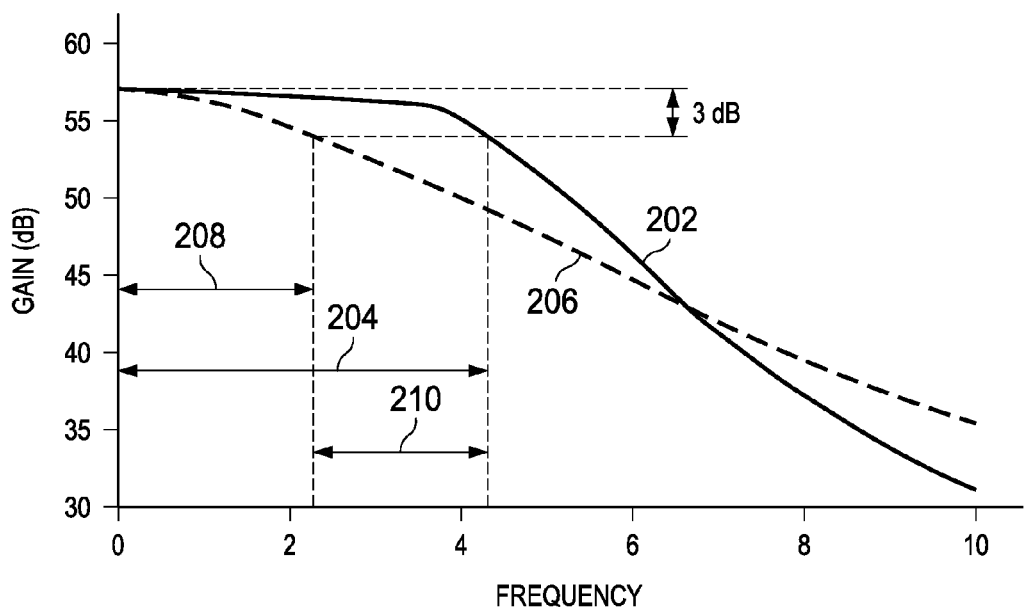
FIG. 2 (prior art) is a graph of an example curve of gain (dB) versus frequency for the amplifier of FIG. 1.
Figure 3:
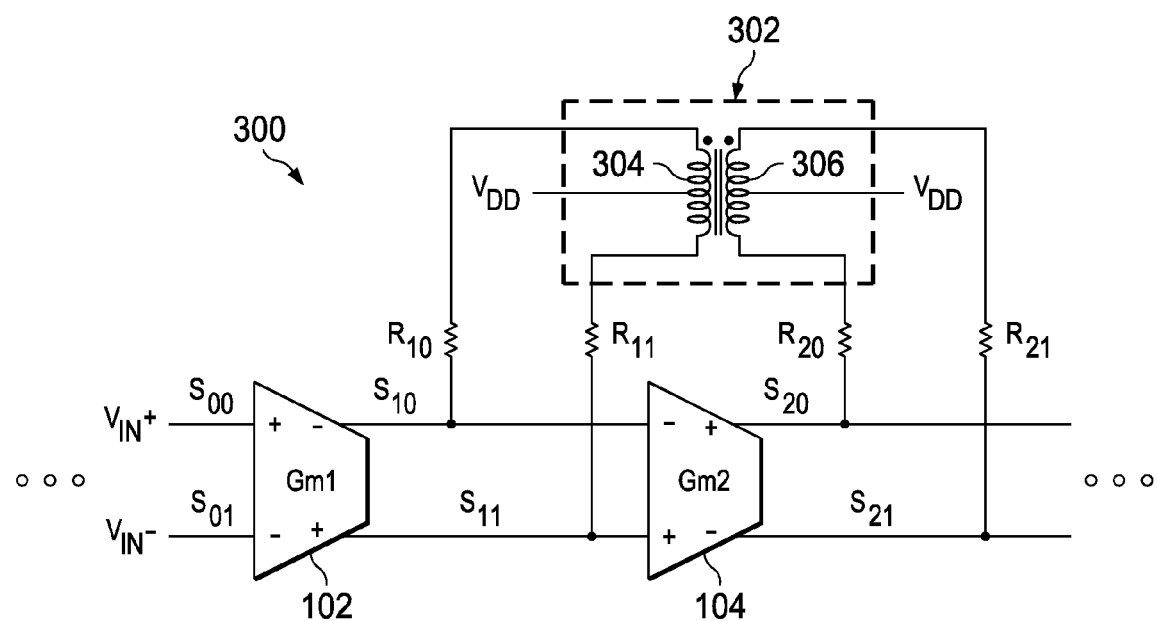
FIG. 3 is a schematic electrical circuit diagram of a multi-stage amplifier of the illustrative embodiments.

FIG. 3 is a schematic electrical circuit diagram of a multi-stage amplifier, indicated generally at 300, of the illustrative embodiments. The amplifier 300 includes at least the first and second stages 102 and 104, and the resistors $R_{10}$, $R_{11}$, $R_{20}$ and $R_{21}$. However, instead of $L_1$ and $L_2$ (FIG. 1), the amplifier 300 includes a transformer, indicated by dashed enclosure 302.

The first and second stages 102 and 104 are transconductance amplifiers whose gains are Gm1 and Gm2, respectively. The first stage 102 applies the gain Gm1 to amplify the difference ("$\Delta N_{IN}$") between $V_{IN}+$ and $V_{IN}-$. Similarly, the second stage 104 applies the gain Gm2 to amplify the difference ("$\Delta V_1$") between $S_{10}$'s voltage ("$V_{10}$") and $S_{11}$'s voltage ("$V_{11}$"). Accordingly: (a) in response to $\Delta V_{IN}$, the first stage 102 generates the difference ("$\Delta I_1$") between $S_{10}$'s current ("$I_{10}$") and $S_{11}$'s current ("$I_{11}$"); and (b) in response to $\Delta V_1$, the second stage 104 generates the difference ("$\Delta I_2$") between $S_{20}$'s current ("$I_{20}$") and $S_{21}$'s current ("$I_{21}$").

In this example: (a) if $\Delta V_{IN}$ is positive, then $\Delta I_1$ is negative; and (b) conversely, if $\Delta V_{IN}$ is negative, then $\Delta I_1$ is positive. Similarly, in this example: (a) if $\Delta V_1$ is positive, then $\Delta I_2$ is negative; and (b) conversely, if $\Delta V_1$ is negative, then $\Delta I_2$ is positive.

The transformer 302 includes first and second coils 304 and 306. As shown in FIG. 3: (a) $R_{10}$ is coupled through a first terminal of the coil 304 to $V_{DD}$; (b) $R_{11}$ is coupled through a second terminal of the coil 304 to $V_{DD}$ (which is coupled to a third terminal of the coil 304); (c) $R_{21}$ is coupled through a first terminal of the coil 306 to $V_{DD}$; and (d) $R_{20}$ is coupled through a second terminal of the coil 306 to $V_{DD}$ (which is coupled to a third terminal of the coil 306). Current flows: (a) through the coil 304 in a first direction; and (b) through the coil 306 in a second direction that is substantially identical to (e.g., same as) the first direction.

If the transformer 302 is ideal, lossless and perfectly coupled, then $V_2 = n \cdot V_1$, $I_2 = I_1/n$, and $P_{IN} = P_{OUT}$, where: (a) $V_1$ is a voltage across the first and second terminals of the coil 304; (b) $V_2$ is a voltage across the first and second terminals of the coil 306; (c) $I_1$ is a current through the coil 304; (d) $I_2$ is a current through the coil 306; (e) n is a winding turns ratio between the coils 304 and 306, so that n equals winding turns of the coil 306 divided by winding turns of the coil 304; (f)

$V_1 \cdot I_1 = P_{IN}$, which is input power of the transformer 302; and (g) $V_2 \cdot I_2 = P_{OUT}$, which is output power of the transformer 302.

The coil 304 provides passive impedance boost to the output lines $S_{10}$ and $S_{11}$ of the stage 102. Similarly, the coil 306 provides passive impedance boost to the output lines $S_{20}$ and $S_{21}$ of the stage 104. Also, due to coupling between the coils 304 and 306: (a) the coil 304 provides active feedback to the output lines $S_{20}$ and $S_{21}$ of the stage 104; and (b) the coil 306 provides active feedback to the output lines $S_{10}$ and $S_{11}$ of the stage 102. Such active feedback reduces cost and size of the transformer 302.

Moreover, the stages 102 and 104 can be spaced more closely to one another, which reduces silicon area in an integrated circuit that contains the amplifier 300. For example, the amplifier 300 includes one transformer (e.g., the transformer 302) per two stages (e.g., the stages 102 and 104), instead of one passive magnetic component per stage. Also, instead of avoiding magnetic field coupling, the transformer 302 contains a magnetic field with controlled H-field coupling between the coils 304 and 306. Such containment reduces proliferation (adulteration) between nearby circuitry (e.g., nearby magnetic devices).

For these various reasons, 3 dB bandwidth of the amplifier 300 is expanded. For this purpose of bandwidth expansion, the quality factor ("QF") of the transformer 302 is not required to be high. Accordingly, the amplifier 300 can have a reduced form factor.

Although illustrative embodiments have been shown and described by way of example, a wide range of alternative embodiments is possible within the scope of the foregoing disclosure.

What is claimed is:

1. An amplifier, comprising:
   a first stage for receiving a differential input voltage, which is formed by first and second input voltages, and outputting a first differential current in response thereto on first and second lines having respective first and second line voltages;
   a second stage coupled to the first stage for receiving the first and second line voltages and outputting a second differential current in response thereto on third and fourth lines having respective third and fourth line voltages; and
   a transformer coupled to the first and second stages, wherein the transformer includes first and second coils, wherein a first terminal of the first coil is coupled through a first resistor to the first line, wherein a second terminal of the first coil is coupled through a second resistor to the second line, wherein a first terminal of the second coil is coupled through a third resistor to the third line, and wherein a second terminal of the second coil is coupled through a fourth resistor to the fourth line;
   wherein a voltage supply node is coupled to a third terminal of the first coil and to a third terminal of the second coil.

2. The amplifier of claim 1, wherein the first and second stages are first and second transconductance amplifiers having first and second gains, respectively.

3. The amplifier of claim 1, wherein the first coil is for conducting current in a first direction, and wherein the second coil is for conducting current in the first direction.

4. The amplifier of claim 1, wherein the first coil is for providing passive impedance boost to the first and second lines, and wherein the second coil is for providing passive impedance boost to the third and fourth lines.

5. The amplifier of claim 1, wherein the first coil is for providing active feedback to the third and fourth lines, and wherein the second coil is for providing active feedback to the first and second lines.

6. The amplifier of claim 1, wherein the transformer is for containing a magnetic field with controlled H-field coupling between the first and second coils.

7. An amplifier, comprising:
   a first stage for receiving a differential input voltage, which is formed by first and second input voltages, and outputting a first differential current in response thereto on first and second lines having respective first and second line voltages, wherein the first stage is a first transconductance amplifier having a first gain;
   a second stage coupled to the first stage for receiving the first and second line voltages and outputting a second differential current in response thereto on third and fourth lines having respective third and fourth line voltages, wherein the second stage is a second transconductance amplifier having a second gain; and
   a transformer coupled to the first and second stages, wherein the transformer includes first and second coils, wherein a first terminal of the first coil is coupled through a first resistor to the first line, wherein a second terminal of the first coil is coupled through a second resistor to the second line, wherein a first terminal of the second coil is coupled through a third resistor to the third line, wherein a second terminal of the second coil is coupled through a fourth resistor to the fourth line, wherein the first coil is for conducting current in a first direction, and wherein the second coil is for conducting current in a second direction that is substantially identical to the first direction;
   wherein a voltage supply node is coupled to a third terminal of the first coil and to a third terminal of the second coil.

8. The amplifier of claim 7, wherein the first coil is for providing passive impedance boost to the first and second lines and providing active feedback to the third and fourth lines, and wherein the second coil is for providing passive impedance boost to the third and fourth lines and providing active feedback to the first and second lines.

9. The amplifier of claim 8, wherein the transformer is for containing a magnetic field with controlled H-field coupling between the first and second coils.

10. A method, comprising:
    with a first stage of an amplifier, receiving a differential input voltage, which is formed by first and second input voltages, and outputting a first differential current in response thereto on first and second lines having respective first and second line voltages; and
    with a second stage of the amplifier, receiving the first and second line voltages and outputting a second differential current in response thereto on third and fourth lines having respective third and fourth line voltages;
    a first terminal of a first coil of a transformer being coupled through a first resistor to the first line; a second terminal of the first coil being coupled through a second resistor to the second line; a first terminal of a second coil of the transformer being coupled through a third resistor to the third line; a second terminal of the second coil being coupled through a fourth resistor to the fourth line; and a voltage supply node being coupled to a third terminal of the first coil and to a third terminal of the second coil.

11. The method of claim 10, wherein the first and second stages are first and second transconductance amplifiers having first and second gains, respectively.

12. The method of claim 10, and comprising:
through the first coil, conducting current in a first direction; and
through the second coil, conducting current in the first direction.

13. The method of claim 10, and comprising:
with the first coil, providing passive impedance boost to the first and second lines; and
with the second coil, providing passive impedance boost to the third and fourth lines.

14. The method of claim 10, and comprising:
with the first coil, providing active feedback to the third and fourth lines; and
with the second coil, providing active feedback to the first and second lines.

15. The method of claim 10, and comprising:
with the transformer, containing a magnetic field with controlled H-field coupling between the first and second coils.

16. A method, comprising:
with a first stage of an amplifier, receiving a differential input voltage, which is formed by first and second input voltages, and outputting a first differential current in response thereto on first and second lines having respective first and second line voltages, wherein the first stage is a first transconductance amplifier having a first gain;
with a second stage of the amplifier, receiving the first and second line voltages and outputting a second differential current in response thereto on third and fourth lines having respective third and fourth line voltages, wherein the second stage is a second transconductance amplifier having a second gain;
a first terminal of a first coil of a transformer being coupled through a first resistor to the first line; a second terminal of the first coil being coupled through a second resistor to the second line; a first terminal of a second coil of the transformer being coupled through a third resistor to the third line; a second terminal of the second coil being coupled through a fourth resistor to the fourth line; and a voltage supply node being coupled to a third terminal of the first coil and to a third terminal of the second coil;
through the first coil, conducting current in a first direction; and
through the second coil, conducting current in a second direction that is substantially identical to the first direction.

17. The method of claim 16, and comprising:
with the first coil, providing passive impedance boost to the first and second lines, and providing active feedback to the third and fourth lines; and
with the second coil, providing passive impedance boost to the third and fourth lines, and providing active feedback to the first and second lines.

18. The method of claim 17, and comprising:
with the transformer, containing a magnetic field with controlled H-field coupling between the first and second coils.

* * * * *